United States Patent
Zeng et al.

(10) Patent No.: US 11,355,888 B2
(45) Date of Patent: Jun. 7, 2022

(54) CONNECTOR ASSEMBLY, POWER SUPPLY ASSEMBLY AND ELECTRONIC DEVICE

(71) Applicant: GUANGDONG OPPO MOBILE TELECOMMUNICATIONS CORP., LTD., Guangdong (CN)

(72) Inventors: Wuchun Zeng, Guangdong (CN); Zanjian Zeng, Guangdong (CN); Zhigang Sun, Guangdong (CN); Feng Xiong, Guangdong (CN); Mingkun Zhao, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 233 days.

(21) Appl. No.: 16/613,093

(22) PCT Filed: May 7, 2018

(86) PCT No.: PCT/CN2018/085901
§ 371 (c)(1),
(2) Date: Nov. 12, 2019

(87) PCT Pub. No.: WO2018/205906
PCT Pub. Date: Nov. 15, 2018

(65) Prior Publication Data
US 2020/0185860 A1     Jun. 11, 2020

(30) Foreign Application Priority Data

May 12, 2017 (CN) .......................... 201710345509.3

(51) Int. Cl.
*H01R 13/639*     (2006.01)
*H01R 12/71*     (2011.01)
(Continued)

(52) U.S. Cl.
CPC ......... *H01R 13/639* (2013.01); *H01R 12/716* (2013.01); *H01R 12/721* (2013.01);
(Continued)

(58) Field of Classification Search
CPC .......... H05K 3/36; H05K 3/361; H05K 3/365; H01R 12/716; H01R 12/721;
(Continued)

(56) References Cited

U.S. PATENT DOCUMENTS 5,730,619 A * 3/1998 Hamlin .................. H01R 12/57
439/493
5,871,369 A * 2/1999 Obayashi ............... H01R 12/78
439/495

(Continued)

FOREIGN PATENT DOCUMENTS

CN     1223482 A     7/1999
CN     2629246 Y     7/2004
(Continued)

OTHER PUBLICATIONS

International Search Report (ISR) and Written Opinion (WO) dated Aug. 2, 2018 for Application No. PCT/CN2018/085901.

(Continued)

*Primary Examiner* — Abdullah A Riyami
*Assistant Examiner* — Marcus E Harcum
(74) *Attorney, Agent, or Firm* — Ladas & Parry LLP

(57) ABSTRACT

A connector assembly is configured to connect a first circuit board and a second circuit board. The connector assembly includes a board-to-board connector, a buckle pressing plate and a pressing and covering piece. The buckle pressing plate and the board-to-board connector which is spaced from the buckle pressing plate are arranged on the second circuit board, and the board-to-board connector is connected with the first circuit board to enable the first circuit board to be (Continued)

electrically connected with the second circuit board. The pressing and covering piece includes a covering portion and a buckling portion extending from a first end of the covering portion. The buckling portion is connected to the buckle pressing plate in a buckling manner. The covering portion presses and covers the board-to-board connector to fix the board-to-board connector on the second circuit board. A power supply assembly and an electronic device are also provided.

18 Claims, 4 Drawing Sheets

(51) Int. Cl.
   *H01R 12/72* (2011.01)
   *H01R 13/512* (2006.01)
   *H04M 1/02* (2006.01)
   *H05K 3/36* (2006.01)

(52) U.S. Cl.
   CPC ............ *H01R 13/512* (2013.01); *H04M 1/02* (2013.01); *H05K 3/36* (2013.01)

(58) Field of Classification Search
   CPC .... H01R 12/777; H01R 12/79; H01R 13/639; H01R 13/512; H01R 13/627; H04M 1/0252; H04M 1/0277
   USPC ............................................ 439/331, 67, 493
   See application file for complete search history.

(56) References Cited

U.S. PATENT DOCUMENTS

| | | | | |
|---|---|---|---|---|
| 5,947,764 A * | 9/1999 | Pan | ........................ | H01R 12/57 439/492 |
| 5,971,772 A * | 10/1999 | Wang | ..................... | H01R 12/88 439/67 |
| 6,338,653 B1 | 1/2002 | Jones et al. | | |
| 6,371,770 B1 * | 4/2002 | Lai | ........................ | G06F 1/1616 439/534 |
| 7,077,689 B2 * | 7/2006 | Holzle | ................. | H01R 12/772 439/494 |
| 7,153,144 B2 * | 12/2006 | Ohsawa | ............. | H01R 12/7076 439/67 |
| 7,238,032 B2 * | 7/2007 | Pabst | .................... | H01R 13/635 439/67 |
| 7,261,570 B1 | 8/2007 | Polnyi et al. | | |
| 7,399,192 B2 * | 7/2008 | Yamamoto | ............. | H01R 12/79 439/260 |
| 7,407,408 B1 * | 8/2008 | Taylor | .................... | H05K 1/118 439/449 |
| 7,442,047 B1 * | 10/2008 | Schmidgall | ............ | H01R 12/62 439/67 |
| 7,654,829 B1 * | 2/2010 | Chuang | .................. | H01R 12/79 439/67 |
| 8,821,177 B2 * | 9/2014 | Kubo | ........................ | A61B 1/04 439/271 |
| 9,531,121 B1 * | 12/2016 | Senofsky | ........... | H01R 13/6273 |
| 10,109,946 B2 * | 10/2018 | Lee | ........................... | H05K 1/14 |
| 2004/0082211 A1 * | 4/2004 | Hsieh | ....................... | H04R 1/06 439/329 |
| 2006/0292900 A1 * | 12/2006 | Pabst | ..................... | H01R 12/79 439/67 |
| 2007/0123089 A1 * | 5/2007 | Nishio | ................. | H01R 13/639 439/342 |
| 2008/0233793 A1 * | 9/2008 | Ju | .......................... | H01R 12/79 439/493 |
| 2009/0208168 A1 * | 8/2009 | Ishikawa | .............. | H01R 13/639 385/14 |
| 2014/0140018 A1 * | 5/2014 | Malek | ..................... | H05K 1/147 361/749 |
| 2014/0148021 A1 * | 5/2014 | Hsu | ........................ | H01R 12/79 439/67 |
| 2014/0148030 A1 * | 5/2014 | Makimura | ......... | H01R 13/5219 439/271 |
| 2014/0304985 A1 * | 10/2014 | Nagase | ............ | H01R 13/62933 29/747 |
| 2015/0044887 A1 * | 2/2015 | Tateishi | ................. | H01R 12/79 439/65 |
| 2015/0194753 A1 * | 7/2015 | Raff | ....................... | H05K 1/183 439/75 |
| 2015/0222029 A1 * | 8/2015 | Neu | .................... | H01R 13/5804 439/159 |
| 2018/0226736 A1 * | 8/2018 | Hirakawa | .............. | H01R 12/79 |
| 2018/0294603 A1 * | 10/2018 | Nishi | .................... | H01R 13/639 |
| 2021/0083439 A1 * | 3/2021 | Zeng | ..................... | H01M 50/20 |

FOREIGN PATENT DOCUMENTS

| | | |
|---|---|---|
| CN | 101727564 A | 6/2010 |
| CN | 101752695 A | 6/2010 |
| CN | 202009133 U | 10/2011 |
| CN | 101752695 B | 3/2012 |
| CN | 102455735 A | 5/2012 |
| CN | 107086384 A | 8/2017 |
| CN | 206907947 U | 1/2018 |
| TW | 1394333 B1 | 4/2013 |

OTHER PUBLICATIONS

The extended European search report for the corresponding EP patent application No. 18799292.0, dated Aug. 13, 2020.
The first Examination report for the corresponding IN patent application No. 201917048183, dated Oct. 26, 2020.
European Examination Report for European Application No. 18 799292.0, dated Oct. 29, 2021 (10 pages).

* cited by examiner

CONNECTOR ASSEMBLY, POWER SUPPLY ASSEMBLY AND ELECTRONIC DEVICE

CROSS-REFERENCE TO RELATED APPLICATIONS

The present application is a national stage application of International Patent Application No. PCT/CN2018/085901, which is filed on May 7, 2018 and claims priority to Invention Patent Application No. 201710345509.3, submitted to the State Intellectual Property Office of China on 2017 May 12 and entitled "Connector assembly, Power Supply Assembly and Mobile Terminal".

TECHNICAL FIELD

The application relates to the technical field of connection of electronic devices, and more particularly to a connector assembly, a power supply assembly and an electronic device with the connector assembly and the power supply assembly.

BACKGROUND

In a present electronic device, e.g., a mobile phone, two circuit boards are usually required to be connected through a board-to-board connector. For example, in a present mobile phone, a circuit board bearing or connected with one or more functional elements is usually electrically connected to a main board through a board-to-board connector. However, a board-to-board connector is usually instable, making the circuit board easily disconnected from the main board. Under some circumstances, a board-to-board connector is directly screwed to a main board through screws and pressure of the screws is shared by the board-to-board connector to improve stability of the board-to-board connector. However, the screws are usually installed in a final assembling stage, and if falling of a screw occurs in a screwing process, the screw may be hard to take out and therefore may be left on the main board or the circuit board, which may easily short-circuit other electronic components to cause a safety accident.

SUMMARY

The embodiments of the application provide a connector assembly, a power supply assembly and an electronic device which can improve safety.

For solving the technical problem, an embodiment of the application provides a connector assembly, which is configured to connect a first circuit board and a second circuit board and includes a board-to-board connector, a buckle pressing plate and a pressing and covering piece. The buckle pressing plate and the board-to-board connector which is spaced from the buckle pressing plate are arranged on the second circuit board, and the board-to-board connector is connected with the first circuit board to enable the first circuit board to be electrically connected with the second circuit board; the pressing and covering piece includes a covering portion and a buckling portion extending from a first end of the covering portion, the buckling portion is connected to the buckle pressing plate in a buckling manner, and the covering portion presses and covers the board-to-board connector to fix the board-to-board connector on the second circuit board.

Another embodiment of the application provides a power supply assembly configured to be electrically connected with a second circuit board. The power supply assembly includes a battery, a first circuit board, a board-to-board connector, a buckle pressing plate and a pressing and covering piece. The buckle pressing plate and the board-to-board connector which is spaced from the buckle pressing plate are arranged on the second circuit board. The pressing and covering piece includes a covering portion and a buckling portion extending from a first end of the covering portion, the buckling portion is connected to the buckle pressing plate in a buckling manner, and the covering portion presses and covers the board-to-board connector to enable the first circuit board to be electrically connected with the second circuit board. The battery is electrically connected to the board-to-board connector through the first circuit board, and is connected with the second circuit board through the board-to-board connector.

Still another embodiment of the application provides an electronic device, which includes a power supply assembly and a second circuit board. The power supply assembly includes a battery, a first circuit board, a board-to-board connector, a buckle pressing plate and a pressing and covering piece. The buckle pressing plate and the board-to-board connector which is spaced from the buckle pressing plate are arranged on the second circuit board. The pressing and covering piece includes a covering portion and a buckling portion extending from a first end of the covering portion, the buckling portion is connected to the buckle pressing plate in a buckling manner, and the covering portion presses and covers the board-to-board connector to enable the first circuit board to be electrically connected with the second circuit board. The battery is electrically connected to the board-to-board connector through the first circuit board, and is connected with the second circuit board through the board-to-board connector.

According to the connector assembly, power supply assembly and electronic device provided in the embodiments of the application, the buckling portion of the pressing and covering piece is connected with the buckle pressing plate fixed on the second circuit board in the buckling manner, so that the covering portion of the pressing and covering piece can stably press and cover the board-to-board connector. As such, the structure of the board-to-board connector is stable, and a safety accident is unlikely to happen in an assembling process of the connector assembly, thereby improving the safety performance.

BRIEF DESCRIPTION OF THE DRAWINGS

In order to describe the technical solutions of embodiments of the application more clearly, the drawings required by descriptions about the embodiments will be simply introduced below. It is apparent that the drawings described below are only some embodiments of the application, and those of ordinary skill in the art may also obtain other obvious transformed modes according to these drawings without creative work.

DETAILED DESCRIPTION OF THE EMBODIMENTS

Figure 1:
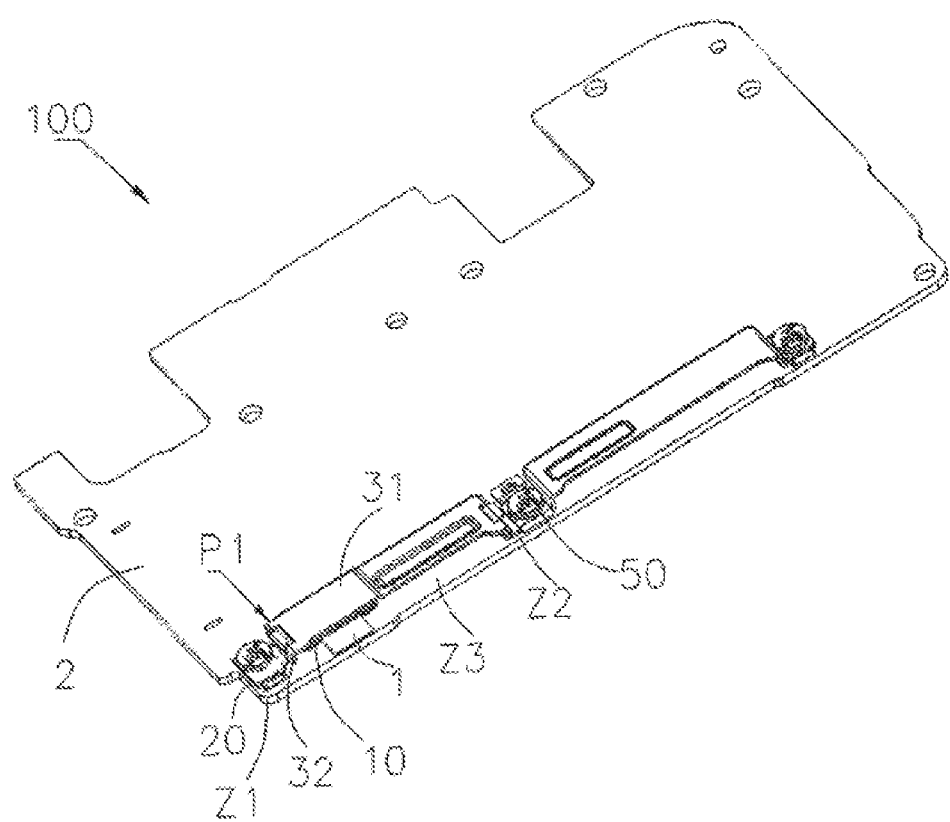
FIG. 1 is an assembly schematic diagram of a connector assembly according to an embodiment of the application.

The technical solutions in the embodiments of the application will be described clearly and completely below in combination with the drawings in the embodiments of the application. It is apparent that the described embodiments are not all the embodiments but only part of embodiments of the application. All other embodiments obtained by those of ordinary skill in the art based on the embodiments in the application without creative work shall fall within the scope of protection of the application.

In the descriptions about the embodiments of the application, it is to be understood that a directional or positional relation indicated by terms "thickness" and the like is a directional or positional relationship shown in the drawings. The terms are adopted not to imply or indicate that an involved device or element must have a specific direction and be structured and operated in the specific direction, but only to facilitate and simplify the description of the application and thus should not be understood as limits to the embodiments of the application.

Figure 2:
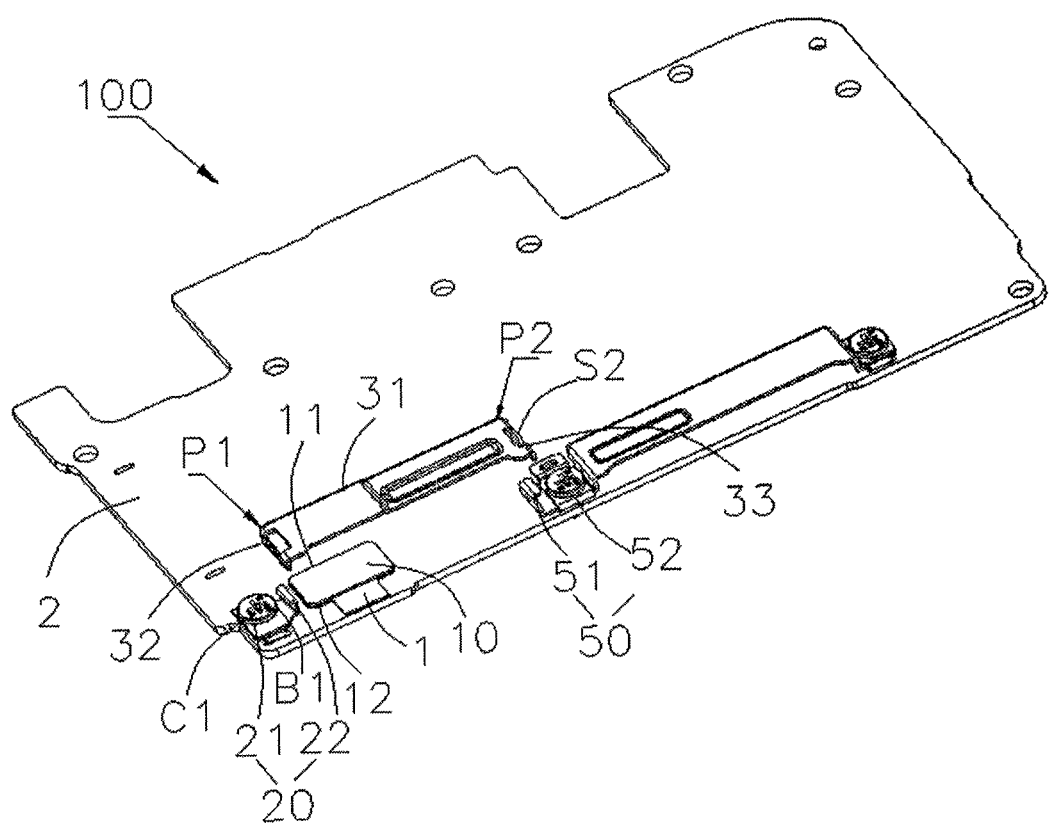
FIG. 2 is an exploded view of a connector assembly according to an embodiment of the application.

Referring to FIG. 1 and FIG. 2, FIG. 1 is an assembly schematic diagram of a connector assembly 100 according to an embodiment of the application, and FIG. 2 is an exploded view of part of elements of the connector assembly 100. The embodiment of the application provides a connector assembly 100. The connector assembly 100 is configured to connect a first circuit board 1 to a second circuit board 2. The connector assembly 100 includes a board-to-board connector 10, a buckle pressing plate 20 and a pressing and covering piece 30. The buckle pressing plate 20 and the board-to-board connector 10 are arranged on the second circuit board 2, and the board-to-board connector 10 is further configured to connect the first circuit board 1. The buckle pressing plate 20 is spaced from the board-to-board connector 10. The pressing and covering piece 30 includes a covering portion 31 and a buckling portion 32 extending from a first end P1 of the covering portion 31. The buckling portion 32 is connected to the buckle pressing plate 20 in a buckling manner. The covering portion 31, when the buckling portion 32 is buckled to the buckle pressing plate 20, presses and covers the board-to-board connector 10.

Therefore, under a pressing and covering action of the pressing and covering piece 30, the board-to-board connector 10 can be closely fixed on the second circuit board 2. Since the pressing and covering piece 30 is finally connected with the buckle pressing plate 20 on the second circuit board 2 in the buckling manner, risks caused by use of a screw can be avoided.

The board-to-board connector 10 is electrically connected with the first circuit board 1 and the second circuit board 2 respectively, so that the first circuit board 1 and the second circuit board 2 may be electrically connected with each other through the board-to-board connector 10.

Figure 3:
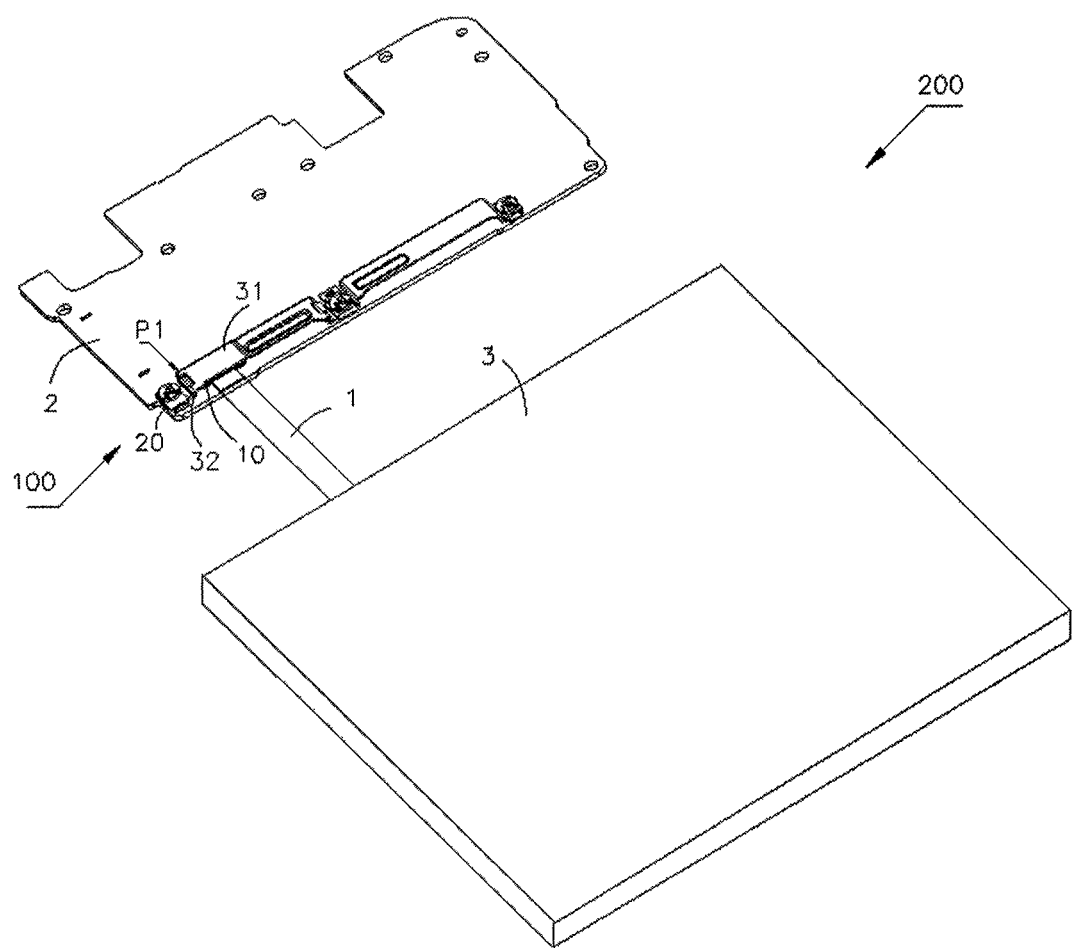
FIG. 3 is a schematic diagram of a power supply assembly according to an embodiment of the application.
Figure 4:
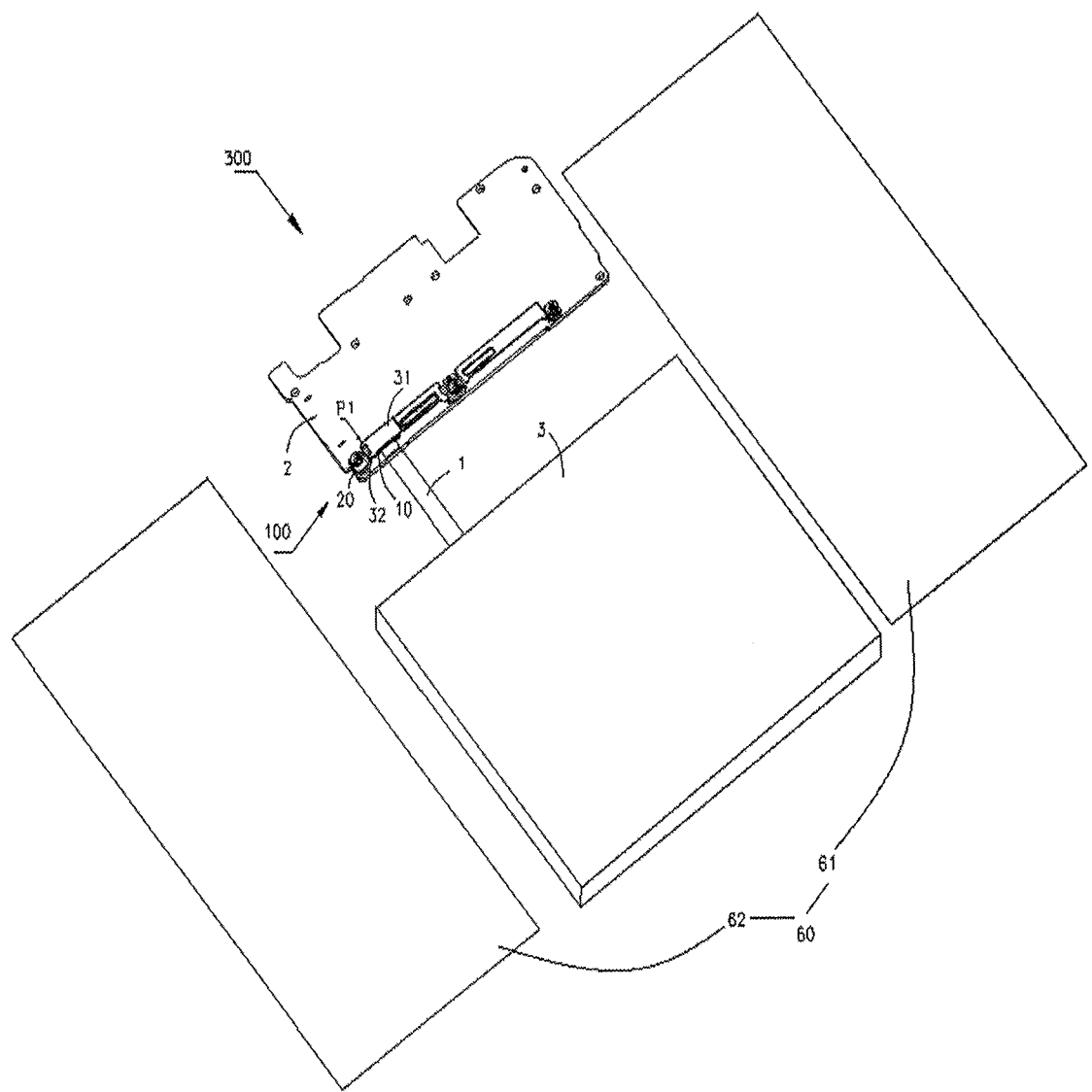
FIG. 4 is a schematic diagram of an electronic device according to an embodiment of the application.

It can be understood that the connector assembly 100 may be applied to an electronic device 300 (shown in FIG. 4). Under such a situation, the second circuit board 2 is a main board of the electronic device 300, and the first circuit board 1 is a flexible circuit board or a printed circuit board bearing or connected with one or more functional elements (as shown in FIG. 3 or FIG. 4). By virtue of the connector assembly 100, the one or more functional elements born on or connected to the first circuit board 1 can be electrically connected to the second circuit board 2 serving as the main board. The electronic device 300 may be a mobile phone, a tablet computer, a notebook computer or the like.

As shown in FIG. 2, the buckle pressing plate 20 includes a pressing plate portion 21, and the buckle pressing plate 20 is fixedly connected to the second circuit board 2 through the pressing plate portion 21.

The buckle pressing plate 20 further includes a first clamping hook 22 formed by bending from an edge of the pressing plate portion 21. A first clamping slot S1 is formed in the buckling portion 32 of the pressing and covering piece 30, and the buckling portion 32 is connected with the first clamping hook 22 of the buckle pressing plate 20 in the buckling manner through the first clamping slot S1.

Therefore, in the embodiment of the application, the buckle pressing plate 20 may be fixed on the second circuit board 2 at first, and after the board-to-board connector 10 is assembled, the buckling portion 32 of the pressing and covering piece 30 is connected with the buckle pressing plate 20 in the buckling manner to buckle and press the pressing and covering piece 30 on the board-to-board connector 10 so as to fix the board-to-board connector 10. In addition, since the buckling manner is adopted for connection, the problems of short circuit caused by the falling of a screw during the fixing process of the screw are solved.

As shown in FIG. 2, the pressing plate portion 21 is fixedly connected to the second circuit board 2 in a screw locking manner. For example, as shown in FIG. 2, the pressing plate portion 21 is fixed on the second circuit board 2 through a screw C1. Since the pressing plate portion 21 can be locked through the screw before the board-to-board connector 10 is assembled, the screw, even when falling, can be conveniently taken out, and fixation of the pressing plate portion 21 in the screw locking manner does not have any potential safety hazard. Apparently, in other embodiments, the pressing plate portion 21 may alternatively be fixed on the second circuit board 2 in other manners such as welding, adhesion and the like.

The first clamping hook 22 is formed by firstly extending, for a preset distance, from an edge of a first side B1, which is close to the board-to-board connector 10, of the pressing plate portion 21 in a first direction away from the second circuit board 2, and then extending in a second direction away from the board-to-board connector 10. That is, the first clamping hook 22, when being observed from a viewing angle shown in FIG. 2, is formed into a "7"-shaped clamping hook.

The buckling portion 32 of the pressing and covering piece 30 is formed by extending from the first end P1 of the covering portion 31 in a direction towards the second circuit board 2, and the first clamping slot S1 in the buckling portion 32 is formed in a portion, connected with the covering portion 31, on the buckling portion 32. That is, the first clamping slot S1 is formed on a bend of the pressing and covering piece 30.

In some embodiments, the first clamping hook 22 has an elastic restoring force. When the buckling portion 32 is being buckled to the first clamping hook 22 of the buckle pressing plate 20, the buckling portion 32 moves downwards to drive the first clamping hook 22 to move towards the board-to-board connector 10. When the buckling portion 32 moves downwards to align the first clamping slot S1 of the buckling portion 32 with the first clamping hook 22, the first clamping hook 22 moves towards the first clamping slot S1 due to the elastic restoring force and therefore is accommodated in the first clamping slot S1. In this way, the buckling portion 32 is connected with the first clamping hook 22 in the buckling manner.

As shown in FIG. 2, the pressing and covering piece 30 further includes a fixing portion 33 extending from a second end P2 of the covering portion 31. The connector assembly 100 further includes a fixing piece 50 fixed on the second circuit board 2. The fixing piece 50 and the buckle pressing plate 20 are arranged on two sides of the board-to-board connector 10 respectively. The fixing portion 33 of the pressing and covering piece 30 is buckled to the fixing piece 50 to fix the pressing and covering piece 30 (specifically, the second end P2 of the covering portion 31) on the second circuit board 2. The second end P2 and the first end P1 are two opposite ends of the covering portion 31.

A second clamping slot S2 is formed in the fixing portion 33, the fixing piece 50 includes a second clamping hook 51 formed by bending from an edge of the fixing piece 50, and the fixing portion 33 is connected with the second clamping hook 51 of the fixing piece 50 in the buckling manner through the second clamping hook S2.

The second clamping hook 51 may also be formed by bending and extension, after extension from the edge of the fixing piece 50 to a direction away from the second circuit board for a preset distance, to a direction away from the board-to-board connector 10. That is, the second clamping hook 51, when being observed from the viewing angle shown in FIG. 2, is formed into an inverted "L"-shaped clamping hook.

The second clamping slot S2 may also be formed in a portion, connected with the pressing and covering piece 31, on the fixing portion 33.

As shown in FIG. 2, the fixing piece 50 further includes a connecting portion 52, and the connecting portion 52 is fixed on the second circuit board 2, so that the fixing piece 50 is fixedly connected to the second circuit board 2 through the connecting portion 52. The connecting portion 52 may also be fixed on the second circuit board 2 in the screw locking manner.

In some embodiments, the buckle pressing plate 20 and the fixing piece 50 may have the same structure and may be symmetrically arranged at two ends of the pressing and covering piece 30. In other embodiments, the fixing piece 50 may be fixedly connected with the fixing portion 33 in other manners. In the embodiment of the application, it is only necessary to ensure that the buckling portion 32 of the pressing and covering piece 30 is connected with the buckle pressing plate 20 in the buckling manner.

In an assembling process, the fixing portion 33 of the pressing and covering piece 30 is fixedly connected with the fixing portion 50 at first, then the board-to-board connector 10 is assembled on the second circuit board 2, and finally, the buckling portion 32 of the pressing and covering piece 30 is connected with the buckle pressing plate 20 in the buckling manner. In such a manner, the covering portion 31 of the pressing and covering piece 30 presses and covers the board-to-board connector 10 to fasten the board-to-board connector 10, and meanwhile, a final assembling step is implemented in the buckling manner, so that the risk that the screw falls is avoided.

As shown in FIG. 2, the board-to-board connector 10 includes a first connecting piece 11 and a second connecting piece 12 in insertion connection with the first connecting piece 11, the first connecting piece 11 is fixed to the second circuit board 2, the covering portion 31 presses and covers the second connecting piece 12, and the second connecting piece 12 is connected with the first circuit board 1.

The first connecting piece 11 is electrically connected with the second circuit board 2, and the second connecting piece 12 is electrically connected with the first circuit board 1. The first connecting piece 11 and the second connecting piece 12 are in insertion connection and are conducted such that the first circuit board 1 is electrically connected through the board-to-board connector 10. The first circuit board 1 is electrically connected with at least one functional device, so that the at least one functional device electrically connected with the first circuit board 1 is electrically connected with the second circuit board 2. The first connecting piece 11 is detachably connected with the second connecting piece 12, so that the first connecting piece 11 can be conveniently separated from the second connecting piece 12, and the at least one functional device can be conveniently maintained. The covering portion 31 applies pressure to the second connecting piece 12 to ensure that the second connecting piece 12 is in insertion connection with the first connecting piece 11 more stably, so that the second circuit board 2 is unlikely to disconnect from the at least one functional device, thus improving the stability of the connector assembly 100. As described above, the first circuit board 1 may be a flexible circuit or a printed circuit board configured to bear or connect at least one functional device, and the second circuit board 2 may be a main board.

Referring to FIG. 3, a schematic diagram of a power supply assembly 200 is shown. The power supply assembly 200 includes a battery 3, a first circuit board 1 and a connector assembly 100.

The battery 3 is electrically connected with the first circuit board 1 or mounted on the first circuit board 1.

The battery 3 is connected with the connector assembly 100 through the first circuit board 1, and is electrically connected with the second circuit board 2 through the connector assembly 100, so that the battery 3 may be electrically connected with the second circuit board 2.

As shown in FIG. 4, an embodiment of the application also provides an electronic device 300. The electronic device 300 includes a connector assembly 100, a power supply assembly 200, a second circuit board 2 and housing 60. Both the connector assembly 100 and the power supply assembly 200 are fixedly accommodated in the housing 60. The housing 60 includes a front cover 61 and a rear cover 62 connected with the front cover 61 in a covering manner. The connector assembly 100 and the power supply assembly 200 are fixedly accommodated in a housing space formed by the front cover 61 and the rear cover 62. In a process of fixing the battery 3 of the power supply assembly 200 to the housing 60, the battery 3 is required to be firstly electrically connected with the first circuit board 1, and then the first circuit board 1 is electrically connected with the second connecting piece 12 of the board-to-board connector 10. After the second connecting piece 12 is in insertion connection with the first connecting piece 11, the pressing and covering piece 30 presses and covers the second connecting piece 12. Therefore, a mounting process of the power supply assembly 200 and the battery 3 thereof is convenient, and safety is improved.

As shown in FIG. 1, in an implementation mode, the second circuit board 2 further includes a first fixing region Z1, a second fixing region Z2 and a conductive region Z3. The board-to-board connector 10 is arranged in the conductive region Z3, and is electrically connected with the second circuit board 2 through the conductive region Z3. The first fixing region Z1 and the second fixing region Z2 are located on two sides of the conductive region Z3 respectively. The buckle pressing plate 20 is fixedly arranged in the first fixing region Z1, and the fixing piece 50 is fixedly arranged in the second fixing region Z2.

In the example, the pressing and covering piece 30 is a strip-type plate.

The battery 3 may be a lithium battery, a nickel metal hydride battery or the like. The electronic device 300 may be a terminal product such as a mobile phone, a tablet computer, a notebook computer or a camera.

According to the connector assembly 100, power supply assembly 200 and electronic device 300 provided in the embodiments of the application, the buckling portion 32 of the pressing and covering piece 30 is connected with the buckle pressing plate 20 in the buckling manner, so that the covering portion 31 of the pressing and covering piece 30 can stably press and cover the board-to-board connector 10. As such, the structure of the board-to-board connector 10 is stable, risks caused when fixing the board-to-board connector 10 with a screw are avoided, and safety performance is improved.

The above is the exemplary embodiments of the application. It is to be pointed out that those of ordinary skill in the art may further make a plurality of improvements and embellishments to without departing from the principle of the application and these improvements and embellishments shall also fall within the scope of protection of the application.

What is claimed is:

1. A connector assembly, configured to connect a first circuit board and a second circuit board, wherein the connector assembly comprises a board-to-board connector, a buckle pressing plate and a pressing and covering piece, the buckle pressing plate and the board-to-board connector which is spaced from the buckle pressing plate are arranged on the second circuit board, and the board-to-board connector is connected with the first circuit board, to enable the first circuit board to be electrically connected with the second circuit board, the pressing and covering piece comprises a covering portion and a buckling portion extending from a first end of the covering portion, the buckling portion is configured to be connected to the buckle pressing plate in a buckling manner, and the covering portion presses and covers the board-to-board connector to fix the board-to-board connector on the second circuit board; wherein the pressing and covering piece further comprises a fixing portion extending from a second end of the covering portion, the connector assembly further comprises a fixing piece configured to be fixed on the second circuit board, and the fixing piece is fixedly connected with the fixing portion to fixedly connect the fixing portion to the second circuit board, wherein the second end and the first end are two opposite ends of the covering portion.

2. The connector assembly as claimed in claim 1, wherein the buckle pressing plate comprises a pressing plate portion, and the buckle pressing plate is fixedly connected to the second circuit board through the pressing plate portion.

3. The connector assembly as claimed in claim 2, wherein the buckle pressing plate further comprises a first clamping hook formed by bending from an edge of the pressing plate portion, a first clamping slot is formed in the buckling portion, and the buckling portion is connected with the first clamping hook of the buckle pressing plate in the buckling manner through the first clamping slot.

4. The connector assembly as claimed in claim 2, wherein the pressing plate portion is fixedly connected to the second circuit board in a screw locking manner.

5. The connector assembly as claimed in claim 3, wherein the first clamping hook is formed by firstly extending, for a preset distance, from an edge of a first side, which is close to the board-to-board connector, of the pressing plate portion in a first direction away from the second circuit board, and then extending in a second direction away from the board-to-board connector.

6. The connector assembly as claimed in claim 5, wherein the buckling portion is formed by extending from the first end of the covering portion in a direction towards the second circuit board, and the first clamping slot in the buckling portion is formed in a portion, connected with the covering portion, on the buckling portion.

7. The connector assembly as claimed in claim 1, wherein a second clamping slot is formed in the fixing portion, the fixing piece comprises a second clamping hook formed by bending from an edge of the fixing piece, and the fixing portion is fixedly connected with the second clamping hook of the fixing piece through the second clamping slot.

8. The connector assembly as claimed in claim 1, wherein the board-to-board connector comprises a first connecting piece and a second connecting piece in insertion connection with the first connecting piece, the first connecting piece is fixed to the second circuit board, the covering portion presses and covers the second connecting piece, the second connecting piece is connected with the first circuit board, and the first circuit board is electrically connected with the second circuit board through the board-to-board connector.

9. A power supply assembly configured to be electrically connected with a second circuit board, the power supply assembly comprising a battery, a first circuit board, a board-to-board connector, a buckle pressing plate and a pressing and covering piece, the buckle pressing plate and the board-to-board connector which is spaced from the buckle pressing plate are arranged on the second circuit board, the buckle pressing plate is spaced from the board to board connector, the pressing and covering piece comprises a covering portion and a buckling portion extending from a first end of the covering portion, the buckling portion is connected to the buckle pressing plate in a buckling manner, and the covering portion, presses and covers the board-to-board connector to enable the first circuit board to be electrically connected with the second circuit board; and the battery is electrically connected to the board-to-board connector of the connector assembly through the first circuit board, and is connected with the second circuit board through the board-to-board connector; wherein the pressing and covering piece further comprises a fixing portion extending from a second end of the covering portion, the power supply assembly further comprises a fixing piece configured to be fixed on the second circuit board, and the fixing piece is fixedly connected with the fixing portion to fixedly connect the fixing portion to the second circuit board, wherein the second end and the first end are two opposite ends of the covering portion.

10. The power supply assembly as claimed in claim 9, wherein the buckle pressing plate comprises a pressing plate portion, and the buckle pressing plate is fixedly connected to the second circuit board through the pressing plate portion.

11. The power supply assembly as claimed in claim 10, wherein the buckle pressing plate further comprises a first clamping hook formed by bending from an edge of the pressing plate portion, a first clamping slot is formed in the buckling portion, and the buckling portion is connected with the first clamping hook of the buckle pressing plate in the buckling manner through the first clamping slot.

12. The power supply assembly as claimed in claim 10, wherein the pressing plate portion is fixedly connected to the second circuit board in a screw locking manner.

13. The power supply assembly as claimed in claim 11, wherein the first clamping hook is formed by firstly extending, for a preset distance, from an edge of a first side, which is close to the board-to-board connector, of the pressing plate portion in a first direction away from the second circuit board, and then extending in a second direction away from the board-to-board connector.

14. The power supply assembly as claimed in claim 13, wherein the buckling portion is formed by extending from the first end of the covering portion in a direction towards the second circuit board, and the first clamping slot in the buckling portion is formed in a portion, connected with the covering portion, on the buckling portion.

15. The power supply assembly as claimed in claim 9, wherein a second clamping slot is formed in the fixing portion, the fixing piece comprises a second clamping hook formed by bending from an edge of the fixing piece, and the fixing portion is connected with the second clamping hook of the fixing piece in the buckling manner through the second clamping slot.

16. The power supply assembly as claimed in claim 9, wherein the board-to-board connector comprises a first connecting piece and a second connecting piece in insertion connection with the first connecting piece, the first connecting piece is fixed to the second circuit board, the covering portion presses and covers the second connecting piece, the second connecting piece is connected with the first circuit board, and the first circuit board is electrically connected with the second circuit board through the board-to-board connector.

17. An electronic device, comprising a power supply assembly and a second circuit board, the power supply assembly being electrically connected with the second circuit board;

the power supply assembly comprises a battery, a first circuit board, a board-to-board connector, a buckle pressing plate and a pressing and covering piece; the buckle pressing plate and the board-to-board connector which is spaced from the buckle pressing plate are arranged on the second circuit board; the pressing and covering piece comprises a covering portion and a buckling portion extending from a first end of the covering portion, the buckling portion is connected to the buckle pressing plate in a buckling manner, and the covering portion presses and covers the board-to-board connector to enable the first circuit board to be electrically connected with the second circuit board; and the battery is electrically connected to the board-to-board connector through the first circuit board, and is connected with the second circuit board through the board-to-board connector; wherein the pressing and covering piece further comprises a fixing portion extending from a second end of the covering portion, the power supply assembly further comprises a fixing piece configured to be fixed on the second circuit board, and the fixing piece is fixedly connected with the fixing portion to fixedly connect the fixing portion to the second circuit board, wherein the second end and the first end are two opposite ends of the covering portion.

18. The electronic device as claimed in claim 17, further comprising housing, both the power supply assembly and the second circuit board being accommodated in the housing.

\* \* \* \* \*